United States Patent [19]

Gulati

[11] Patent Number: 4,513,432
[45] Date of Patent: Apr. 23, 1985

[54] MULTIPLE SELF-CONTAINED LOGIC GATE COUNTER CIRCUIT

[75] Inventor: Surender K. Gulati, Catasauqua, Pa.

[73] Assignee: AT&T Bell Laboratories, Murray Hill, N.J.

[21] Appl. No.: 393,544

[22] Filed: Jun. 30, 1982

[51] Int. Cl.³ .................. H03K 21/06; H03K 21/10; H03K 23/08
[52] U.S. Cl. .................. 377/121; 307/272 A; 307/279; 377/47; 377/55; 377/56; 377/111; 377/114; 377/117
[58] Field of Search ............... 307/443, 453, 468, 481, 307/272 A, 279, 291; 377/47, 55, 56, 72, 74, 77, 79–81, 105, 111, 114–117, 121

[56] References Cited

U.S. PATENT DOCUMENTS

| | | | |
|---|---|---|---|
| 3,783,306 | 1/1974 | Hoffmann | 307/450 X |
| 4,037,085 | 7/1977 | Minorikawa | 377/116 |
| 4,218,750 | 8/1980 | Carter et al. | 377/111 X |
| 4,300,060 | 11/1981 | Yu | 307/272 A |

Primary Examiner—Stanley D. Miller
Assistant Examiner—D. R. Hudspeth
Attorney, Agent, or Firm—Irwin Ostroff

[57] ABSTRACT

A multibit counter circuit uses a plurality of essentially identical stages which each have a feedback circuit, a flip-flop, and a carry circuit. Each of the stages is connected together in essentially the same way. A counter circuit of any desired bit capacity can be relatively quickly and easily formed with a saving in silicon area compared to standard configurations.

8 Claims, 4 Drawing Figures

1000

4,513,432

MULTIPLE SELF-CONTAINED LOGIC GATE COUNTER CIRCUIT

BACKGROUND OF THE INVENTION

This invention relates to logic circuitry and in particular to counters used as part of VSLI circuits.

Many of the counters available use a flip-flop circuit and a series of logic gates for each bit of the counter. The logic gates used typically increase in complexity as the number of bits of the counter increases, and in addition the numbers of interconnections between bits increase with an increase in the number of bits. This results in layout problems for the integrated circuit designer and causes a greater area of silicon to be needed than is, in many cases, desirable.

It is desirable to have a multibit capacity counter circuit which comprises a standard stage which can be coupled to other identical stages to form the desired bit capacity counter without the interconnections between adjacent stages increasing as the number of needed bits increases. Such a counter offers simplicity of design and silicon area efficiencies.

SUMMARY OF THE INVENTION

The present invention is directed to circuitry comprising a plurality of interconnected essentially identical stages, in which each stage, with the possible exception of the first and last stages, comprises a memory circuit having a first input terminal, a second input clock terminal, and an output terminal, a feedback circuit having a first input feedback terminal coupled to the output terminal of the memory circuit, a second input inhibit terminal, and an output terminal coupled to the first input terminal of the memory circuit, and carry circuit means having first and second input terminals, and an output terminal. The first input terminal of the carry circuit means is coupled to the output terminal of the memory circuit. The second input terminal of the carry circuit means is coupled to the second input inhibit terminal of the same stage and is also coupled to the output terminal of the carry circuit means of a preceding stage if one exists. The carry circuit means of each stage, except for possibly the last stage, is adapted to generate a signal which selectively inhibits the memory circuit of a subsequent stage from changing an output logic state such that the circuitry performs a counting function.

Any desired bit capacity counter circuit can be easily designed by using one stage of the present invention for each bit of needed capacity. The interconnections between adjacent stages are essentially identical and independent of the number of stages. Accordingly, any desired bit capacity counter circuit can be fabricated in silicon with relative ease by using the stage of the present invention as the basic building block.

The counter of the present invention also allows synchronous clear and preset operations.

These and other features and advantages of the present invention are better understood from a consideration of the following detailed description taken in conjunction with the accompanying drawings.

DETAILED DESCRIPTION

Figure 1:
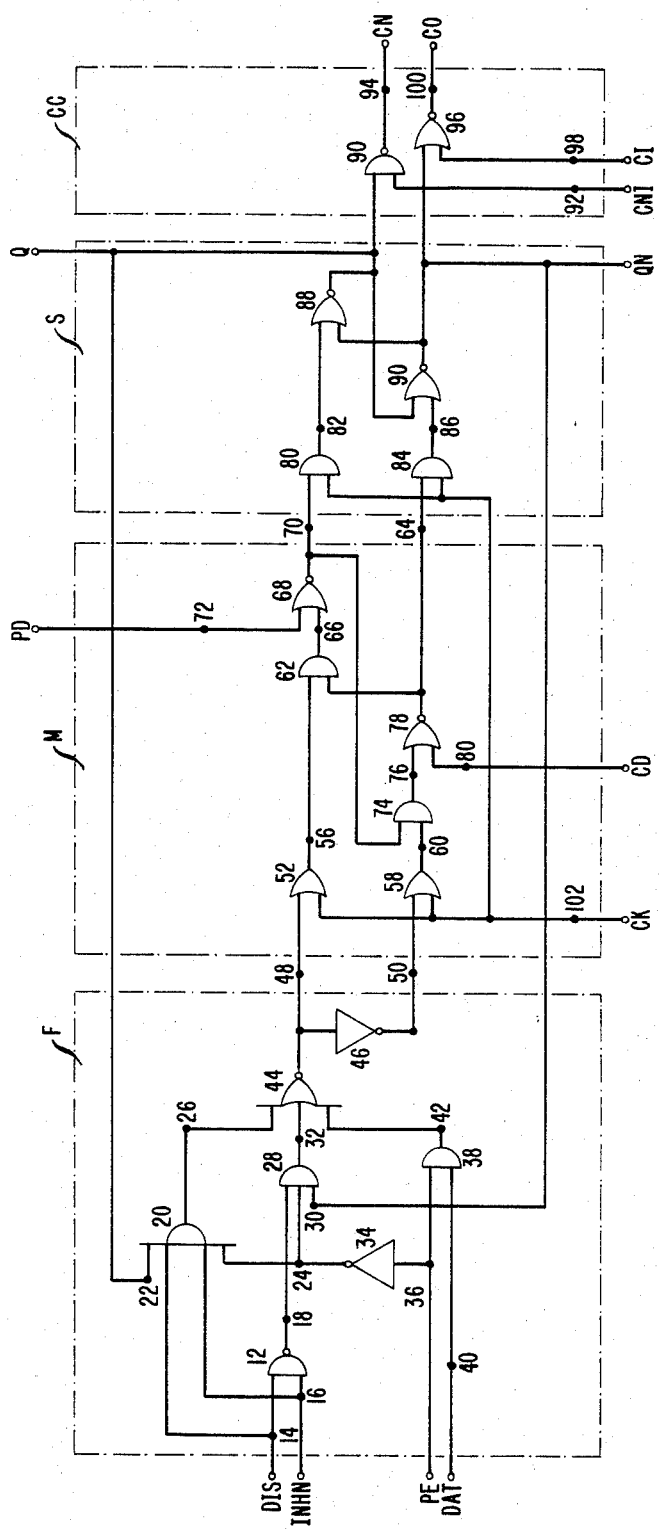
FIG. 1 illustrates in logic block diagram form an embodiment in accordance with the present invention.

Referring now to FIG. 1, there is illustrated in logic block diagram form a counter circuit 10 which comprises a feedback section (illustrated within the dashed line rectangle F), a master section (illustrated within the dashed line rectangle M), a slave section (illustrated within the dashed line rectangle S), and a carry circuit (illustrated within the dashed line rectangle CC). The M and S sections form a master-slave flip-flop circuit having a Q output terminal and a complementary QN output terminal. A digital clock signal (not illustrated) is applied to a terminal CK of counter circuit 10. Counter circuit 10 serves to effectively count the number of pulses received at terminal CK and provides a representation of the number of clock pulses at output terminals Q QO. The frequency of pulses appearing at output terminals Q and QN is one-half that of the clock signal which is applied to the terminal CK. Circuit 10 functions essentially as a one stage counter.

Figure 4:
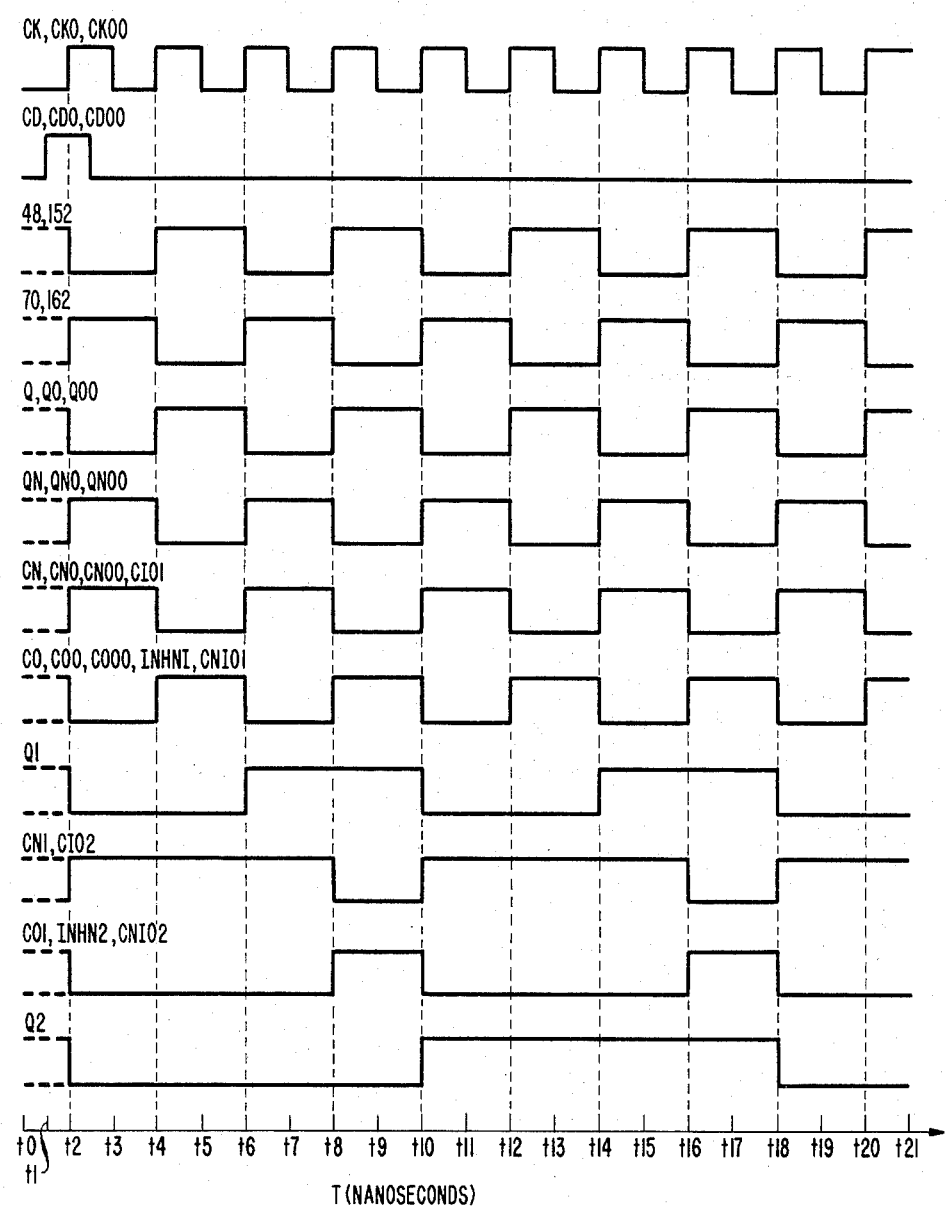
FIG. 4 illustrates various logic waveforms applied to and generated by the embodiments of FIGS. 1, 2, and 3.

CC acts to generate signals at output terminals CN and CO which are intended to be coupled to input terminals of an essentially identical second state, as is the case in a three stage counter circuit 1000 illustrated in FIG. 4. These signals generated at terminals CN and CO are used to control the operation of a second stage which generates comparable signals that are used to control a third stage.

Feedback circuit F comprises essentially a two-input NAND gate 12, a four-input AND gate 20, a three-input AND gate 28, a two-input AND gate 38, a three-input NOR gate 44, a first inverter 34, and a second inverter 46. A first input terminal of NAND gate 12 is coupled to a second input terminal of AND gate 20, to a disabled terminal DIS, and to a terminal 14. A second input terminal of NAND gate 12 is coupled to a third input terminal of AND gate 20, to an inhibit terminal INHN, and to a terminal 16. An output terminal of NAND gate 12 is coupled to a first input terminal of AND gate 28 and to a terminal 18.

A first input terminal of inverter 34 is coupled to a first input terminal of AND gate 38, to a parallel enable terminal PE, and to a terminal 36. An output terminal of inverter 34 is coupled to a second input terminal of AND gate 28, to a fourth input terminal of AND gate 20, and to a terminal 24. A second input terminal of AND gate 38 is coupled to a data terminal DAT and to a terminal 40.

A first input terminal of AND gate 20 is coupled to the Q output terminal and to a terminal 22. An output terminal of AND gate 20 is coupled to a first input terminal of NOR gate 44 and to a terminal 26. An output terminal of AND gate 28 is coupled to a second input terminal of NOR gate 44 and to a terminal 32. An output terminal of AND gate 38 is coupled to a third input terminal of NOR gate 44 and to a terminal 42. An output terminal of NOR gate 44 is coupled to an input terminal of inverter 46 and to an output terminal 48 of the feedback circuit F. An output terminal of inverter 46 is coupled to a second output terminal 50 of feedback circuit F. Output terminals 48 and 50 generate complementary signals.

The master section M comprises a first two-input OR gate 52, a second two-input NOR gate 58, a first two-input AND gate 62, a second two-input AND gate 74, a first two-input NOR gate 68, and a second two-input NOR gate 78.

The first and second input terminals of OR gates 52 and 58 are coupled to terminals 48 and 50, respectively. An output terminal of OR gate 52 is coupled to a first input terminal of AND gate 62 and to a terminal 56. A first output terminal of OR gate 58 is coupled to a second input terminal of AND gate 74 and to a terminal 60. An output terminal of AND gate 62 is coupled to a second input terminal of OR gate 68 and to a terminal 66. A first input terminal of OR gate 68 is coupled to a preset terminal PD and to a terminal 72. An output terminal of NOR gate 68 is coupled to a first input terminal of AND gate 74 and to a terminal 70 which serves as a first output terminal of M. An output terminal of AND gate 74 is coupled to a first input terminal of NOR gate 78 and to a terminal 76. A second input terminal of NOR gate 78 is coupled to a clear terminal CD and to a terminal 80. An output terminal of NOR gate 78 is coupled to a second input terminal of AND gate 62, and to a second output terminal 64 of M. Terminals 70 and 64 generate complementary signals.

Slave section S comprises a first two-input AND gate 80, a second two-input AND gate 84, a first two-input NOR gate 88, and a second two-input NOR gate 90. The first input terminals of AND gates 80 and 84 are coupled to terminals 70 and 64, respectively. Second input terminals of AND gates 80 and 84 are coupled to second input terminals of OR gates 52 and 58, and are coupled to a clock terminal CK, and to a terminal 102. An output terminal of AND gate 80 is coupled to a first input terminal of NOR gate 88 and to a terminal 82. An output terminal of AND gate 84 is coupled to a second input terminal of NOR gate 90 and to a terminal 85. A second input terminal of NOR gate 88 is coupled to an output terminal of NOR gate 90, to the ON output terminal, and to a terminal 30. An output terminal of NOR gate 88 is coupled to the Q output terminal, and to terminal 22.

Counter circuit CC comprises a two-input NAND gate 90 and a two-input NOR gate 96. A first input terminal of NAND gate 90 is coupled to output terminal Q. A first input terminal of NOR gate 96 is coupled to output terminal QN. A second input of NAND gate 90 is coupled to a first carry input terminal CNI and to a terminal 92. A second input terminal of NOR gate 98 is coupled to a second carry input terminal CI and to a terminal 98. An output terminal of NAND gate 90 is coupled to a first carry output terminal CN and to a terminal 94. An output terminal of NOR gate 96 is coupled to a second carry output terminal CO and to a terminal 100.

Terminal CD is set to a high level, a "1", while the clock signal (not illustrated) applied to CK makes a transition from a low level, a "0", to a "1". This clears the Q and QN output terminals and causes same to assume or to be maintained at a "0" and a "1", respectively. Terminal PD is set to a "1" while the clock signal makes a transition from a "0" to a "1". This sets the Q and QN output terminals and causes same to assume or to be maintained at a "1" and a "0", respectively. The clear and set operations are synchronous in that terminals PD and CD affect the master section output terminals 70 and 64 while the clock signal is a "0" and the Q and QN outputs when the clock signal goes to a "1". Terminal PE is set to a "1" level, and terminal DAT is set to a "1" to cause Q and QN to assume or be maintained at a "1" and a "0", respectively, or DAT is set to a "0" to cause Q and QN to assume or be maintained at a "0" and a "1", respectively. Accordingly, terminal PE allows or enables the DAT terminal such that the Q output terminal assumes or is maintained at the same logic state applied to the DAT terminal. Terminals DIS and INHN are typically held at "1's" and do not affect circuitry 10 in this state. When terminals DIS and/or INHN are pulsed to "0's", they serve to not allow the Q and QN terminals to change logic states.

In a one-bit counter which has only one stage which comprises circuit 10, input terminals CNI and CI are held at a "1" and a "0", respectively. The output terminals CN and CO provide an inversion of the output waveforms appearing at terminals Q and QN. As will become clear during the description of FIG. 3, in a multiple bit counter, a plurality of interconnected stages, each like circuit 10, are used, and the equivalent CN and CO outputs of one stage are coupled to equivalent CI and CNI input terminals of the next stage and act to selectively prevent (inhibit) the next stage Q and QN output terminals from changing state so as to establish a counter function. In addition, the CO output terminal of a first stage is coupled to the INHN input terminal of the next stage.

Figure 2:
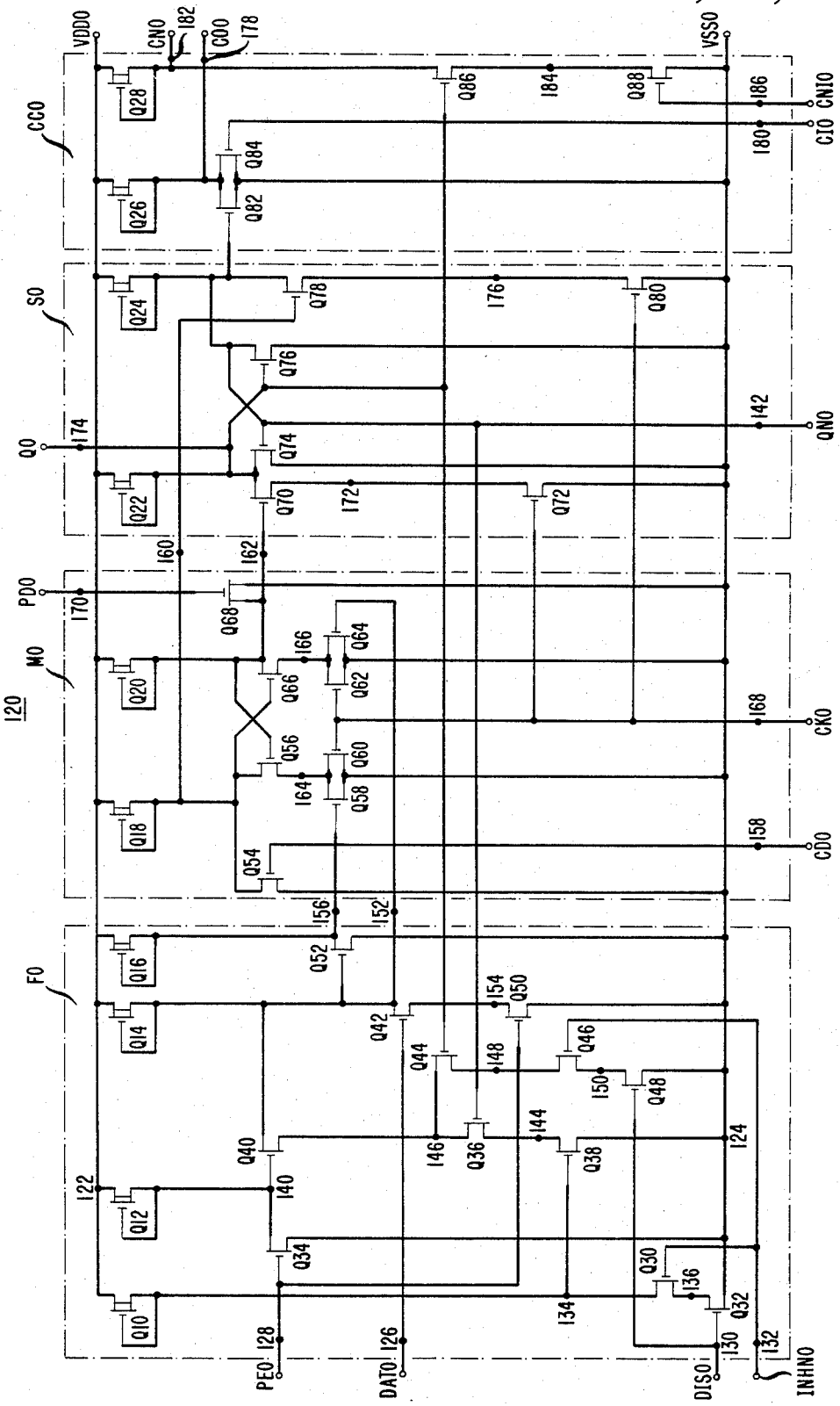
FIG. 2 illustrates a preferred circuit configuration of another embodiment in accordance with the present invention.

Referring now to FIG. 2, there is shown in electrical schematic form a preferred embodiment of a one stage counter circuit 120. Circuit 120 performs the same functions of circuit 10 of FIG. 1 and comprises a feedback circuit (illustrated within the dashed line rectangle FO), a master section (illustrated within the dashed line rectangle MO), a slave section (illustrated within the dashed line recctangle SO), and a counting circuit (illustrated within the dashed line rectangle CCO). These four portions of circuit 120 correspond to the four portions of circuit 10 of FIG. 1 which have the same reference identification with an additional "0" at the end. All of the input and output terminals of circuit 120 which correspond to those of circuit 10 of FIG. 1 have the same reference identification with an additional "0" at the end.

Circuit 120 comprises depletion mode n-channel MOS transistors Q10, Q12, Q14, Q16, Q18, Q20, Q22, Q24, Q26, and Q28 and enhancement mode n-channel MOS transistors Q30, Q32, Q34, Q36, Q38, Q40, Q42, Q44, Q46, Q48, Q50, Q52, Q54, Q56, Q58, Q60, Q62, Q64, Q66, Q68, Q70, Q72, Q74, Q76, Q78, Q80, Q82, Q84, Q86, and Q88. The drains of Q10, Q12, Q14, Q16, Q18, Q20, Q22, Q24, Q26, and Q28 are all coupled together to a terminal 122 and to a terminal VDDO which is connectable to a positive power supply. The sources of Q32, Q34, Q38, Q48, Q50, Q52, Q54, Q58, Q60, Q62, Q64, Q68, Q72, Q74, Q76, Q80, Q82, Q84, and Q88 are all coupled together to a terminal 124 and to a terminal VSSO which is adapted to be coupled to a second power supply which is typically ground potential.

The gate of T42 is coupled to a data input terminal DATO and toe a terminal 126. The gates of Q34 and Q50 are coupled together to a parallel enable terminal PEO and to terminal 128. The gates of Q32 and Q48 are coupled together to a disable terminal DISO and to a terminal 130. The gates of Q30 and Q46 are coupled together to an inhibit terminal INHNO and to a terminal 132. The gate of Q54 is coupled to a clear terminal CDO and to a terminal 158. The gates Q60, Q62, A72, and Q80 are all coupled together to a clock terminal CKO and to a terminal 168. The gate terminal of Q68 is coupled to a preset terminal PDO and to a terminal 170. The gate terminal of Q84 is coupled to a first carry input terminal CIO and to a terminal 180. The gate terminal of Q88 is coupled to a second carry input terminal CNIO and to a terminal 186.

The gate and drain of Q10 are coupled to the drain of Q30, to the gate of Q38, and to a terminal 134. The source of Q30 is coupled to the drain of Q32 and to a terminal 136. The gate and source of Q12 are coupled to the drain of Q34, to the gate of Q40, and to a terminal 140. The source of Q40 is coupled to the drains of Q36 and Q44 and to a terminal 146. The source of Q36 is coupled to the drain of Q38 and to a terminal 144. The gate of Q36 is coupled to the gate of Q74, to the drains of Q76 and Q78, to the source and gate of Q24, to the gate of Q82, to the QN output terminal, and to a terminal 142. The source of Q44 is coupled to the drain of Q46 and to a terminal 148. The source of Q46 is coupled to the drain of Q48 and to a terminal 150. The gate and source of Q14 are coupled to the drains of Q40 and Q42, to the gates of Q52 and Q64, and to a terminal 152 which serves as a first output terminal of FO. The source of Q42 is coupled to the drain of Q50 and to a terminal 154. The gate and source of Q16 are coupled to the drain of Q52, to the gate of Q58, and to a terminal 156 which serves as a second output terminal of F. Terminals 152 and 156 provide complementary output signals.

The gate and source of Q18 are coupled to the drains of Q54 and Q56, the gates of Q66 and Q78, and to a terminal 160 which serves as a first output terminal of M. The source of Q56 is coupled to the drains of Q58 and Q60 and to a terminal 164. The gate and source of Q20 are coupled to the gates of Q56 and Q70, to the drains of Q66 and Q68, and to a terminal 162 which serves as a second output terminal of M. Terminals 160 and 162 provide complementary output signals. The source of Q66 is coupled to the drains of Q62 and Q64 and to a terminal 166.

The gate and source of Q22 are coupled to the drains of Q70 and Q74, to the gates of Q76, Q86, and Q44, to a terminal 174, and to the QO output terminal of SO. The source of Q70 is coupled to the drain of Q72 and to a terminal 172.

The source of Q78 is coupled to the drain of Q80 and to a terminal 176. The gate and source of Q26 are coupled to the drains of Q82 and Q84, to a first output carry terminal COO, and to a terminal 178. The gate and source of Q28 are coupled to the drain of Q86, to a second output terminal CNO, and to a terminal 182. The source of Q86 is coupled to the drain of Q88 and to a terminal 184.

Figure 3:
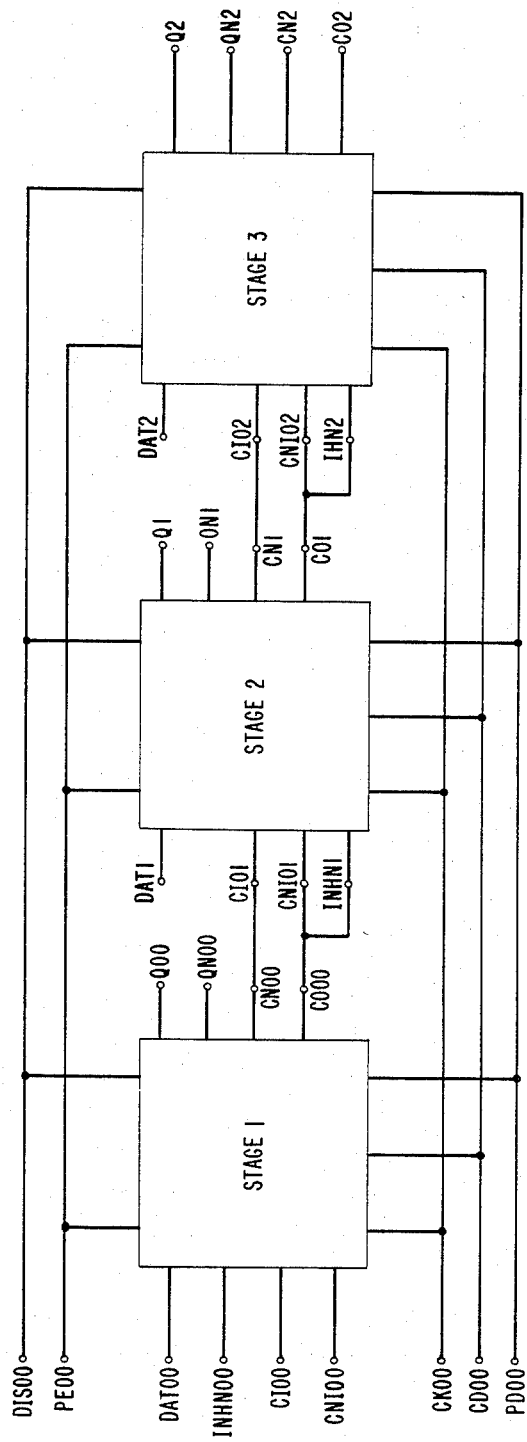
FIG. 3 illustrates a multistage counter circuit embodiment in accordance with still another embodiment of the invention.

Referring now to FIG. 3, there is illustrated a three-bit counter circuit 1000 which comprises stage 1, stage 2, and stage 3. In a preferred embodiment, each of the three stages is essentially identical and essentially comprises circuit 120 of FIG. 2. The input and output terminals of stage 1 have the same reference notations as the corresponding terminals of circuit 120 of FIG. 2 but with an extra "0" at the end. The input and output terminals of stage 2 have the same reference notations as the corresponding terminals of circuit 10 of FIG. 1 but with a "1" at the end. The input and output terminals of stage 3 have the same reference notations as the corresponding terminals of circuit 10 of FIG. 1 but with a "2" at the end. Stages 1, 2, and 3 function essentially as circuits 10 and 120 of FIGS. 1 and 2, respectively.

Stages 1, 2, and 3 each are coupled to input terminals DISOO, PEOO, CKOO, CDOO, and PDOO. Output terminal CNOO of stage 1 is coupled to input terminal CNIO1 of stage 2. Output terminal COOO of stage 1 is coupled to input terminals CNIO1 and INHN1 of stage 2. Output terminal CN1 of stage 2 is coupled to input terminal CIO2 of stage 3. Output terminal CO1 of stage 2 is coupled to input terminals CNIO2 and INHN2 of stage 3. Output terminals CN2 and CO2 of stage 3 are not per se needed for this three-bit counter but would be needed for a four-bit counter which has four stages. Separate data terminals DATOO, DAT1, and DAT2 are coupled to stage 1, stage 2, and stage 3, respectively.

Output terminals QO1 and QNOO of stage 1 generate complementary output signals which have a frequency which is typically one-half of that of a clock signal (not illustrated) coupled to terminal CKOO. Output terminals Q1 and QN1 of stage 2 generate complementary output signals which have a frequency which is typically one-quarter of that of the clock signal coupled to terminal CKOO. Output terminals Q1 and QN1 generate complementary output signals which have a frequency which is typically one-eighth of that of the clock signal coupled to terminal CKOO.

Input inhibit terminals INHN, INHNO, and INHMOO and input disable terminals DIS, DISO, and DISOO are typically held high, a "1". This allows the Q and QN, the QO and QNO, and the QOO QNOO output terminals to change state in response to changes of state in the applied clock signal, assuming such changes are not prevented by signals applied to other input terminals. If the input inhibit and/or disable terminals are held low, a "0", all the output terminals are prevented from changing state. The COOO output terminal of stage 1 provides a signal to the INHN1 input terminal of stage 2 which allows or prevents state changes in the Q1 and QN1 output terminals in order to establish the frequency of the Q1 and QN1 output output signals relative to the frequency of the clock signal. The CO1 output terminal of stage 2 provides a signal to the INHN2 input terminal of stage 3, which allows or prevents state changes in the Q2 and QN2 output terminals in order to establish the frequency of the Q2 and QN2 output signal relative to the frequency of the clock signal.

Referring now to FIG. 4, there are illustrated various waveforms applied to or generated at the various terminals of the embodiments of FIGS. 1, 2, and 3 as a function of time T. These waveforms illustrate the basic counting operation of the various embodiments.

At the beginning of operation, typically a clear pulse is applied to terminals CD, CDO, and CDOO between T=t1 and t3. The clock signal applied to terminals CK, CKO, and CKOO makes a transition from a "0" to a "1" between T=t2− to t2+. With terminals PD, PDO, PDOO, CI, CIO, CIOO, PE, PEO, and PEOO at "0's", and with terminals CNI, CNIO, CNIOO, DIS, DISO, DISOO, INHN, INHNO, and INHNOO are "1's", and terminals DAT, DATO, and DATOO at "1's" or "0's", terminals Q, QO, QOO, Q1, Q2 assume or are maintained at "0's" and QN, QNO, QNOO, QN1 (waveform not illustrated) and QN2 (waveform not illustrated) assume or are maintained at "1's". As is illustrated, the frequency of the waveforms appearing at terminals Q, QO, and QOO is one-half of that of the frequency of the clock waveform applied to terminals CK, CKO, and CKOO. The frequency of the waveforms appearing at terminals Q1 and Q2 is one-fourth and one-eighth, respectively, of the frequency of the clock waveform applied to terminals CK, CKO, and CKOO. The waveforms appearing at terminals CNOO, CIO1, COOO, INHN1, and CNIO1 control (selectively inhibit) stage 2 of FIG. 3 such that the frequency of the output waveform appearing at terminals Q1 and QN1 is one-fourth of the clock signal applied to terminal CKOO. The waveforms appearing at terminals CN1, CIO2, CO1, and INHN2 control (selectively inhibit) stage 3 of FIG. 3 such that the frequency of the output waveforms appearing at terminals Q2 and QN2 is one-eighth of the clock signal applied to terminal CKOO essentially as the stages of FIG. 3, with each stage having the configuration of circuit 120.

A thirteen-bit counter circuit, using 13 interconnected stages, each like circuit 120 of FIG. 2, has been fabricated as a part of a silicon integrated circuit. The fabricated counter was tested and found to be functional. A "1" is typically +5 volts, and a "0" is typically 0 volts.

It is to be understood that the embodiments described herein are merely illustrative of the general principles of the invention. Various modifications are possible within the scope of the invention. For example, circuit 120 could be fabricated using CMOS circuitry, bipolar circuitry, PMOS circuitry, or other available circuitry. Still further, other types of memory circuits could be substituted for the flip-flop illustrated. Still further, any desired bit capacity counter can be formed by using a number of circuit 120's or circuit 10's equal to the bit capacity needed.

What is claimed is:

1. Circuitry comprising:
    a plurality of interconnected essentially identical stages in which each stage, with the possible exception of the first and last stages, comprises:
    a memory circuit having a first input terminal, a second input clock terminal which is for coupling to a source of clock signals, and a first output terminal which is characterized by being at a logic state determined by the memory circuit;
    feedback circuit means having a first input feedback terminal coupled to the memory circuit output terminal, a second input inhibit terminal, and an output terminal coupled to the first input terminal of the memory circuit; and
    carry circuit means having first and second input terminals and a first output terminal;
    the first input terminal of the carry circuit means being coupled to the first output terminal of the memory circuit;
    the second input terminal of the carry circuit means being coupled to the second inhibit input terminal of the feedback circuit means and being coupled to the first output terminal of the carry circuit means of a preceding stage if same exists;
    the carry circuit means of each stage being characterized by generating a signal which selectively inhibits the memory circuit of a subsequent stage from changing the logic state of the output terminal thereof such that the circuitry performs a counting function.

2. The circuitry of claim 1 wherein:
    each memory circuit is a master-slave flip-flop having first and second input terminals and first and second complementary output terminals;
    each carry circuit means further having third and fourth input terminals and a second output terminal;
    the first output terminal of each memory circuit being coupled to the first input terminal of each carry circuit means;
    the second output terminal of each memory circuit being coupled to the third input terminal of each carry circuit means;
    the first output terminal of a carry circuit means of one stage being coupled to the second input terminal of the carry circuit means of a subsequent stage, if a subsequent stage exists, and to the second input inhibit terminal of the feedback circuit means of the same subsequent stage; and
    the second output terminal of each carry circuit means of the stage being coupled to the fourth input terminal of the carry circuit means of a subsequent stage, if a subsequent stage exists;
    the first output terminal of each master-slave flip-flop of a stage is coupled to the first input feedback terminal of that stage; and
    each of the feedback circuit means has a third feedback input terminal which is coupled to the second output terminal of the master-slave flip-flop of the same stage.

3. The circuitry of claim 2 wherein:
    each feedback circuit means has a fourth input disable terminal;
    the fourth input disable terminals of all stages being coupled together;
    each feedback circuit means has a fifth parallel entry input terminal;
    the fifth parallel entry input terminals of all stages are coupled together;
    each feedback circuit means has a sixth data input terminal;
    each master-slave flip-flop has a third input preset terminal and a fourth input clear terminal;
    all of the third input preset terminals are coupled together; and
    all of the fourth input clear terminals are coupled together.

4. The circuitry of claim 3 wherein:
    each of the carry circuit means comprises a first two-input terminal NAND gate and a first two-input terminal NOR gate;
    the first and second input terminals of each carry circuit being coupled to the first and second input terminals, respectively, of the first NAND gate;
    the second output terminal of each carry circuit means being coupled to an output terminal of the first NAND gate;
    the third and fourth input terminals of each carry circuit means being coupled to the first and second input terminals of the first NOR gate; and
    the first output terminal of each carry circuit means being coupled to an output terminal of the first NOR gate.

5. The circuitry of claim 4 wherein:
    each feedback circuit means comprises a second two-input terminal NAND gate, a first four-input terminal AND gate, a second three-input terminal AND gate, a third two-input terminal AND gate, a second three-input terminal NOR gate, and a first one-input terminal INVERTER circuit and a second one-input terminal INVERTER circuit;

in each stage the first output terminal of each flip-flop circuit being coupled to a first input terminal of the first AND gate;

in each stage the second output terminal of the flip-flop circuit being coupled to a third input terminal of the second AND gate of the same stage;

in each stage the fourth input disable terminal being coupled to a first input terminal of the second NAND gate and to a second input terminal of the first AND gate;

in each stage the second inhibit input terminal being coupled to a third input terminal of the first AND gate and to a second input terminal of the second NAND gate;

in each stage the fifth parallel entry input terminal is coupled to an input terminal of the first INVERTER circuit and to a first input terminal of the third AND gate;

in each stage the sixth data input terminal is coupled to the second input terminal of the third AND gate;

in each stage an output terminal of the first inverter is coupled to a fourth input terminal of the first AND gate and to a second input terminal of the second AND gate;

in each stage an output terminal of the second NAND gate is coupled to a first input terminal of the second AND gate;

in each stage an output terminal of the first AND gate is coupled to a first input terminal of the second NOR gate;

in each stage an output terminal of the second AND gate is coupled to a second input terminal of the second NOR gate;

in each stage an output terminal of the third AND gate is coupled to a third input terminal of the second NOR gate;

in each stage an output terminal of the second NOR gate is coupled to a first input terminal of the second INVERTER circuit and to the first input terminal of the flip-flop circuit; and in each stage an output terminal of the second INVERTER circuit is coupled to the second input terminal of the flip-flop.

6. The circuitry of claim 4 wherein:

each carry circuit means comprises first (Q26) and second (Q28) load devices and first (Q82), second (Q84), third (Q86), and fourth (Q88) field effect transistors which each have drain, source, and gate terminals;

the drain terminals of Q82 and Q84 being coupled to a first terminal of the first load device and to the first carry circuit means output terminal;

the drain of Q86 being coupled to one terminal of the second load device and to the second output terminal of the carry circuit means;

the source of Q86 being coupled to the drain of Q88;

the gate terminal of Q84 coupled with the fourth carry input terminal;

the gate terminal of Q88 coupled with the second carry input terminal;

a second terminal of each of the first and second load devices being connectable to power supplies;

the source terminals of Q82, Q84, and Q88 being connected to power supplies;

the second output terminal of the flip-flop being coupled to the gate terminal of Q82; and the first output terminal of the flip-flop being coupled to the gate terminal of Q86.

7. The circuitry of claim 6 wherein:

each of the feedback circuit means comprises third (Q10), fourth (Q12), fifth (Q14), and sixth (Q16) load devices and fifth (Q34), sixth (Q30), seventh (Q32), eighth (Q40), ninth (Q36), tenth (Q38), eleventh (Q44), twelfth (Q46), thirteenth (Q48), fourteenth (Q42), fifteenth (Q50), and sixteenth (Q52) field effect transistors which each have drain, source, and gate terminals;

the gate terminals of Q34 and Q50 being coupled to the fifth parallel entry input terminal;

the gate terminals of Q30 and Q46 being coupled to the second input inhibit terminal;

the gate terminals of Q32 and Q48 being coupled to the fourth input disable terminal;

the gate terminal of Q36 being coupled to the second output terminal of the flip-flop circuit;

the gate terminal of Q44 being coupled to the first output terminal of the flip-flop circuit;

a first terminal of the third load device (Q10) being coupled to the gate terminal of Q38 and to the drain terminal of Q30;

the source terminal of Q30 being coupled to the drain terminal of Q32;

a first terminal of the fourth load device (Q12) being coupled to the drain terminal of Q34 and to the gate terminal of Q40;

a first terminal of the fifth load device (Q14) being coupled to the drain terminals of Q40 and Q42, to the gate of Q52, and to the first input terminal of the flip-flop circuit;

the source terminal of Q40 being coupled to the drain terminals of Q36 and Q44;

the source terminal of Q36 being coupled to the drain terminal of Q38;

the source terminal of Q44 being coupled to the drain terminal of Q46;

the source terminal of Q46 being coupled to the drain terminal of Q48;

the gate terminal of Q42 being coupled to the sixth data input terminal;

a second terminal of each of the third, fourth, fifth, and sixth load devices being connectable to power supplies;

the source terminals of Q32, Q34, Q38, Q48, Q50, Q52 being connectable to power supplies;

the source terminal of Q42 being coupled to the drain terminal of Q50; and a first terminal of the sixth load device being coupled to the drain terminal of Q52 and to a second input terminal of the flip-flop.

8. The circuitry of claim 7 wherein:

each of the load devices is a depletion mode n-channel insulated gate field transistor with the gate and source terminals coupled together and being coupled to the first terminal of the device and the drain terminal being coupled to the second terminal of the load device; and each of the transistors is an enhancement mode n-channel insulated gate field effect transistor.

* * * * *

UNITED STATES PATENT AND TRADEMARK OFFICE
CERTIFICATE OF CORRECTION

PATENT NO. : 4,513,432

DATED : April 23, 1985

INVENTOR(S) : Surender K. Gulati

It is certified that error appears in the above-identified patent and that said Letters Patent is hereby corrected as shown below:

Column 3, line 39, "85" should read --86--; line 41, "ON" should read --QN--. Column 4, line 63, "toe" should read --to--. Column 5, line 2, "A72" should read --Q72--. Column 6, line 17, "QO1" should read --QOO; line 29, "MOO" should read --NOO--; line 31, "QOO" should read --QOO and--. Column 8, line 20, "the" first occurrence should read --one--.

Signed and Sealed this

Twenty-first Day of January 1986

[SEAL]

Attest:

DONALD J. QUIGG

Attesting Officer

Commissioner of Patents and Trademarks